(12) United States Patent
Hughes et al.

(10) Patent No.: US 10,784,890 B1
(45) Date of Patent: Sep. 22, 2020

(54) SIGNAL PROCESSOR

(71) Applicant: Dialog Semiconductor B.V., s-Hertogenbosch (NL)

(72) Inventors: Ashley Hughes, Edinburgh (GB); Wessel Harm Lubberhuizen, Delden (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/407,227

(22) Filed: May 9, 2019

(51) Int. Cl.
*H03M 3/00* (2006.01)
*H03M 1/08* (2006.01)

(52) U.S. Cl.
CPC ......... *H03M 3/436* (2013.01); *H03M 1/0854* (2013.01); *H03M 3/494* (2013.01)

(58) Field of Classification Search
CPC .... H03M 3/494; H03M 3/436; H03M 1/0854; H04S 29/00
USPC .............................. 341/143–144; 381/58, 122
See application file for complete search history.

(56) References Cited

U.S. PATENT DOCUMENTS

| 3,793,513 | A | | 2/1974 | Kaneko |
| 5,262,972 | A | | 11/1993 | Holden et al. |
| 5,301,134 | A | | 4/1994 | Maruyama |
| 5,305,307 | A | * | 4/1994 | Chu ...................... H04M 9/082 370/288 |
| 5,757,862 | A | | 5/1998 | Ishizu |
| 5,946,650 | A | * | 8/1999 | Wei ........................ G10L 25/90 704/207 |
| 7,058,190 | B1 | * | 6/2006 | Zakarauskas .......... H04R 29/00 381/122 |
| 7,636,747 | B2 | | 12/2009 | Watanabe |
| 7,652,604 | B2 | | 1/2010 | Parayandeh et al. |
| 7,696,913 | B2 | | 4/2010 | Melanson |

(Continued)

FOREIGN PATENT DOCUMENTS

| EP | 2 860 874 | 12/2016 |
| GB | 2541977 | 3/2017 |
| WO | WO 2017/190976 | 11/2017 |

OTHER PUBLICATIONS

D.A. Johns et al., "Sigma-delta based IIR filters," [1991] Proceedings of the 34th Midwest Symposium on Circuits and Systems, Monterey, CA, USA, May 1992, pp. 210-213, vol. 1.

(Continued)

*Primary Examiner* — Lam T Mai
(74) *Attorney, Agent, or Firm* — Saile Ackerman LLC; Stephen B. Ackerman (57) ABSTRACT

A signal processor and a method for processing an input signal are presented. The signal processor is adapted to clip an oversampled input signal without introducing noise in the frequency band of interest. For instance, the signal processor may be used for clipping an acoustic signal. The signal processor includes a summer coupled to a limiter and to a feedback circuit. The summer is adapted to sum the input signal with at least one feedback signal to provide an adjusted signal. The limiter is adapted to compare the adjusted signal with a first threshold value and a second threshold value to provide a limited signal. The feedback circuit is adapted to calculate a difference between the limited signal and the adjusted signal, and to generate at least one feedback signal based on the difference.

18 Claims, 9 Drawing Sheets

(56) References Cited

U.S. PATENT DOCUMENTS

| | | | |
|---|---|---|---|
| 7,756,222 B2* | 7/2010 | Chen | H04L 25/067 375/316 |
| 8,467,483 B2 | 6/2013 | Vishakhadatta | |
| 8,644,523 B2 | 2/2014 | Clemow | |
| 8,737,636 B2 | 5/2014 | Park et al. | |
| 8,896,738 B2 | 11/2014 | Sato et al. | |
| 9,053,697 B2 | 6/2015 | Park et al. | |
| 9,065,471 B1 | 6/2015 | Okuda | |
| 9,209,828 B2 | 12/2015 | Schubert et al. | |
| 9,361,872 B2 | 6/2016 | Park et al. | |
| 9,584,146 B2 | 2/2017 | Op 't Eynde et al. | |
| 9,644,561 B2* | 5/2017 | Magner | F02D 41/1454 |
| 9,659,558 B2 | 5/2017 | Park et al. | |
| 9,857,921 B2* | 1/2018 | Pant | G06F 3/0418 |
| 10,236,905 B1 | 3/2019 | Callanan et al. | |
| 2005/0008071 A1 | 1/2005 | Bose et al. | |
| 2005/0053227 A1* | 3/2005 | Fortier | H04B 3/30 379/390.04 |
| 2007/0188218 A1* | 8/2007 | Ueda | H04L 27/2623 327/551 |
| 2007/0273446 A1* | 11/2007 | Kim | H03G 11/002 330/284 |
| 2007/0285160 A1* | 12/2007 | Kim | H03G 3/3026 330/144 |
| 2008/0225168 A1* | 9/2008 | Ouslis | H04N 5/4401 348/554 |
| 2011/0007907 A1 | 1/2011 | Park et al. | |
| 2012/0148074 A1* | 6/2012 | Bastiaens | H04R 19/02 381/191 |
| 2014/0112492 A1 | 4/2014 | Clemow | |
| 2014/0125504 A1 | 5/2014 | Braswell | |
| 2014/0333462 A1* | 11/2014 | Breems | H03M 3/412 341/143 |
| 2016/0173112 A1 | 6/2016 | Das | |

OTHER PUBLICATIONS

D. A. Johns et al., "Design and analysis of delta-sigma based IIR filters," IEEE Transactions on Circuits and Systems II: Analog and Digital Signal, Processing, vol. 40, Issue: 4, Apr. 1993, pp. 233-240.

D. A. Johns et al., "IIR filtering on sigma-delta modulated signals," Electronics Letters, Feb. 14, 1991, vol. 27, No. 4, pp. 307-308.

D. A. Johns, "Analog and Digital State-Space Adaptive IIR Filters", PhD Thesis, Mar. 1989, 153 pages.

D. A. Johns et al., "Adaptive Recursive State-Space Filters Using a Gradient-Based Algorithm," IEEE Transactions on Circuits and Systems, vol. 37, Issue: 6, Jun. 1990, pp. 673-684.

P. W. Wong et al., "FIR Filters with Sigma-Delta Modulation Encoding," IEEE Transactions on Acoustics, Speech, and Signal Processing, vol. 38, Issue: 6, Jun. 1990, pp. 979-990.

Horst Gether et al., A perspective on digital ANC solutions in a low latency dominated world, EDN, Jun. 19, 2017, https://www.edn.com/design/analog/4458544/A-perspective-on-digital-ANC-solutions-in-a-low-latency-dominated-world.

M. A. Aldajani et al., "Stability analysis of an adaptive structure for sigma delta modulation," ICECS 2000. 7th IEEE International Conference on Electronics, Circuits and Systems (Cat. No. 00EX445), Dec. 2000, pp. 129-132, vol. 1.

M. A. Aldajani et al., "Stability and Performance Analysis of an Adaptive Sigma-Delta Modulator," IEEE Transactions on Circuits and Systems II: Analog and Digital Signal Processing, vol. 48, No. 3, Mar. 2001, pp. 233-244.

Robert Bristow-Johnson, DSP Trick: Fixed-Point DC Blocking Filter With Noise-Shaping, dspGuru by lowegian International, Apr. 17, 2011, https://dspguru.com/dsp/tricks/fixed-point-dc-blocking-filter-with-noise-shaping/, accessed on Apr. 18, 2019, 2 pages.

Richard G. Lyons, DSP Tricks: DC Removal, Embedded, Aug. 11, 2008, https://www.embedded.com/design/configurable-systems/4007653/DSP-Tricks-DC-Removal, accessed on Apr. 18, 2019, pp. 1-5.

Richard G. Lyons, Understanding digital signal processing, Second Edition, Prentice Hall PTR, 2004, chapter 13, pp. 84-87.

Ali Grami, Introduction to Digital Communications, Elsevier, 2016, chapter 5, pp. 217-264.

A query on the non-uniform Quantization, Stack Exchange, 2017, https://dsp.stackexchange.com/questions/40137/a-query-on-the-non-uniform-quantization, accessed on Apr. 18, 2019.

Jon Dattorro, The Implementation of Recursive Digital Filters for High-Fidelity Audio, Journal of Audio Engineering Society, Nov. 1988, vol. 36, No. 11, pp. 851-878 and Letters to the Editor.

Thomas Kite, Understanding PDM Digital Audio, Audio Precision Inc., 2012, http://users.ece.utexas.edu/~bevans/courses/rtdsp/lectures/10 Data Conversion/AP Understanding PDM Digital Audio.pdr, accessed on Apr. 18, 2019, pp. 1-9.

Xilinx, CIC, Aug. 2007, https://www.mit.bme.hu/systems/files/oktatas/targyak/8498/CIC_ppt.pdf, accessed in Apr. 18, 2019, 45 pages.

Alan V. Oppenheim et al., "Discrete-Time Signal Processing", 2010 Pearson, p. 412.

U.S. Office Action, U.S. Appl. No. 16/407,250, filed May 9, 2019, Applicant: Hughes et al., dated Feb. 4, 2020, 14 pages.

U.S. Notice of Allowance, U.S. Appl. No. 16/407,242, filed May 9, 2019, Applicant: Hughes et al., dated Jan. 8, 2020, 12 pages.

U.S. Notice of Allowance, U.S. Appl. No. 16/407,247, filed May 9, 2019, Applicant: Hughes et al., dated Jan. 17, 2020, 12 pages.

* cited by examiner

SIGNAL PROCESSOR

RELATED PATENT APPLICATIONS

This application is related to application Ser. No. 16/407,250, filed on May 9, 2019, application Ser. No. 16/407,427, filed on May 9, 2019, application Ser. No. 16/407,242, filed on May 9, 2019, application Ser. No. 16/407,254, filed on May 9, 2019 and application Ser. No. 16/407,232, filed on May 9, 2019, all of which are assigned to a common assignee, and all of which are incorporated by reference in their entirety.

TECHNICAL FIELD

The present disclosure relates to a system and method for processing a signal. In particular the present disclosure relates to a processor for clipping an acoustic signal.

BACKGROUND

Audio devices use multiple signal processing stages to perform various audio functionalities such as active-noise cancellation ANC. For instance a digital microphone may convert a sound into a digital signal to be transmitted for further processing. A digital signal may be encoded using various modulation techniques that includes pulse-code modulation PCM, pulse-density modulation PDM and sigma-delta modulation SDM.

A PCM signal encodes pulses of different heights at a constant frequency. A PCM signal is multi-bit and is typically at the Nyquist frequency. A PDM signal encodes pulses of the same height, hence it requires only one bit that can take any two values, usually represented as 0 and 1 or as 1 and −1. Typically, a PDM signal will be lower resolution but with a higher sampling frequency than a PCM signal. Both PDM and SDM modulation encode signal information using a density of pulses. However, in PDM the pulses are provided between only two quantization levels for instance 0 and 1, whereas in SDM the pulses may be provided between more than two quantisation levels, for instance 3 or 4 levels or more.

Filtering of a digital signal is typically performed on PCM format digital data, however in some applications where the data must be down sampled and converted to PCM before filtering (for example, from a PDM signal), it is desirable to directly filter the digital signal without conversion to PCM. Delays are incurred when a PDM signal is converted to PCM. Further delays are also incurred when the PCM signal is converted back to PDM, as may be required by further blocks in the signal processing chain.

A sigma-delta modulated signal such as a PDM signal is oversampled. Oversampling may be defined as sampling a signal at a sampling frequency higher than the Nyquist rate corresponding to twice the highest frequency component of the signal. By oversampling a signal the noise spectrum may be improved in the range of interest by changing noise distribution.

Modulation of a source signal typically adds out-of-band noise to improve the signal to noise ratio SNR in the band of interest. Given a signal of known amplitude to be modulated, the resulting modulated signal will contain peaks and troughs of higher amplitude than the peaks and troughs of the original signal, due to the added noise.

A signal processing system operating directly on a sigma-delta modulated signal may produce an output signal with more quantization levels than the input signal, increasing the bit-width of each sample. Without any form of low-pass filtering, shaped out-of-band noise will be present in both the input and output signals of such a system.

Subsequent processing blocks may take the high bit-width system output and re-modulate it to use fewer quantization levels. Typical sigma-delta modulators make use of a relatively small number of quantized signal levels to represent the data in comparison to the large number of levels used in a pulse code modulation scheme. Since sigma-delta modulators can only work with a limited number of input signal levels, it may be required to clip the input signal. However clipping a signal with significant out-of-band noise can result in addition of in-band noise. To prevent in-band noise a low pass filter may be used before the clipping stage. However this approach increases the complexity of the system. There is therefore a need for a signal processor adapted to clip an oversampled input signal without introducing noise in the frequency band of interest.

SUMMARY

It is an object of the disclosure to address one or more of the above-mentioned limitations. According to a first aspect of the disclosure, there is provided a signal processor for processing an input signal, the signal processor comprising a summer adapted to sum the input signal with at least one feedback signal to provide an adjusted signal; a limiter adapted to compare the adjusted signal with a first threshold value and a second threshold value to provide a limited signal; a feedback circuit adapted to calculate a difference between the limited signal and the adjusted signal, and to generate the said at least one feedback signal based on the difference.

Optionally, the feedback circuit is adapted to provide an error signal such that when the adjusted signal is greater than the first threshold value, the error signal is equal to the adjusted signal minus the first threshold value; when the adjusted signal is less than the second threshold value, the error signal is equal to the adjusted signal minus the second threshold value; and when the adjusted signal is between the first threshold value and the second threshold value, the error signal is equal to a reference signal.

For instance the reference signal may be a pre-set constant value, for example a zero value. Alternatively the reference signal may vary over time. For instance, the reference signal may have a high frequency component.

Optionally, the feedback circuit is adapted to delay the error signal to generate the said at least one feedback signal.

Optionally, the signal processor is adapted such that when the adjusted signal is greater than the first threshold value, the limited signal is equal to the first threshold value; when the adjusted signal is less than the second threshold value, the limited signal is equal to the second threshold value; and when the adjusted signal is between the first threshold value and the second threshold value, the limited signal is equal to the adjusted signal.

Optionally, the feedback circuit comprises a first subtractor adapted to subtract the first threshold value from the adjusted signal to provide a first error value and a second subtractor adapted to subtract the second threshold value from the adjusted signal to provide a second error value.

Optionally, the feedback circuit comprises a multiplexer having a first input coupled to the first subtractor, a second input coupled to the second subtractor and a third input coupled to a reference source; the multiplexer being coupled to the summer via a first path comprising a first delay.

Optionally, the said at least one feedback signal comprises a first feedback signal and a second feedback signal; the multiplexer being coupled to the summer via the first path and a second path; wherein the first path comprises a first gain element coupled to the first delay to generate the first feedback signal; and wherein the second path comprises the first delay, a second delay and a second gain element to generate the second feedback signal.

Optionally, the signal processor comprises a quantizer to quantize the limited signal.

Optionally, the feedback circuit is adapted to calculate a quantization error, wherein the said at least one feedback signal comprises the quantization error.

Optionally, the feedback circuit comprises an output subtractor adapted to subtract an output of the quantizer from the limited signal to provide the quantization error, and an output summer adapted to sum the error signal with the quantization error to provide an adjusted error signal.

Optionally, the input signal comprises a delta-sigma modulated signal.

Optionally, the input signal comprises a pulse-code modulated signal.

According to a second aspect of the disclosure there is provided a method of processing an input signal, the method comprising summing the input signal with at least one feedback signal to provide an adjusted signal; comparing the adjusted signal with a first threshold value and a second threshold value to provide a limited signal; calculating a difference between the limited signal and the adjusted signal; and generating the said at least one feedback signal based on the difference.

Optionally, the method comprises generating an error signal, wherein when the adjusted signal is greater than the first threshold value, the error signal is equal to the adjusted signal minus the first threshold value; when the adjusted signal is less than the second threshold value, the error signal is equal to the adjusted signal minus the second threshold value; and when the adjusted signal is between the first threshold value and the second threshold value, the error signal is equal to a reference signal.

Optionally, the method comprises delaying the error signal to generate the said at least one feedback signal.

Optionally, the said at least one feedback signal comprises a first feedback signal and a second feedback signal; the method comprising delaying the error signal to obtain a first delayed error signal and delaying the first delayed error signal to obtain a second delayed error signal, generating the first feedback signal based on the first delayed error signal and generating the second feedback signal based on the second delayed error signal.

Optionally, the method comprises quantizing the limited signal.

Optionally, the method comprises calculating a quantization error, wherein the said at least one feedback signal comprises the quantization error.

The method of the second aspect of the disclosure may share any of the features of the first aspect, as noted above and herein.

BRIEF DESCRIPTION OF THE DRAWINGS

The disclosure is described in further detail below by way of example and with reference to the accompanying drawings, in which.

DESCRIPTION

Figure 1A:
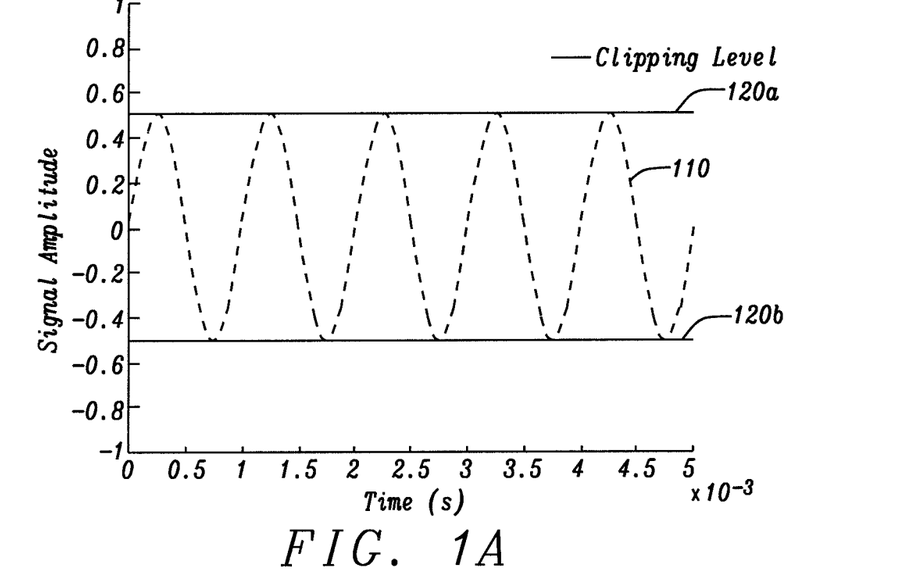
FIG. 1A is a sinusoidal signal encoded using pulse code modulation.
Figure 1B:
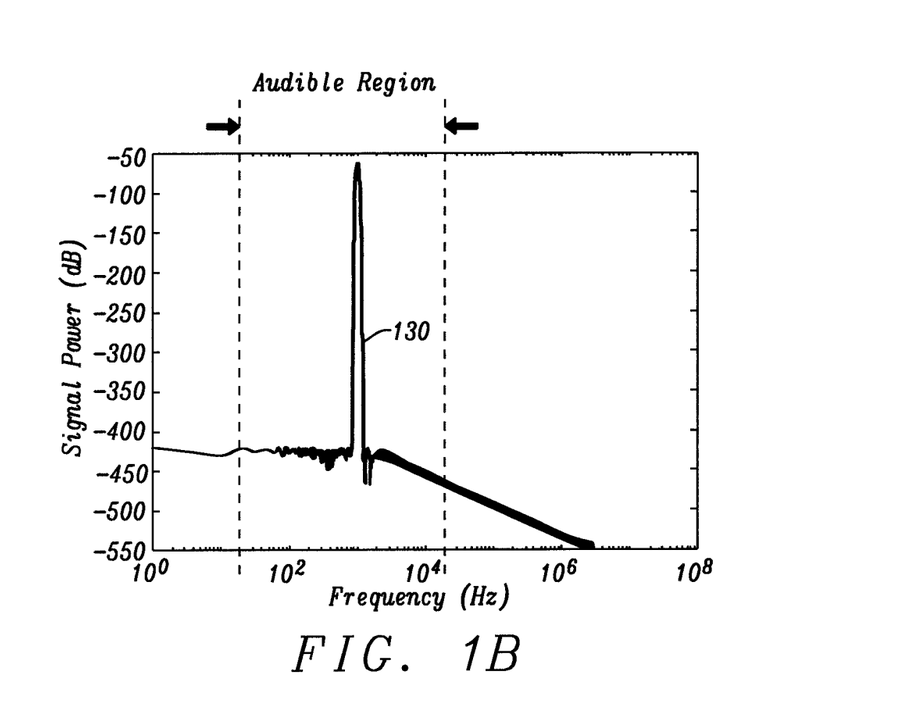
FIG. 1B is the spectrum of the signal of FIG. 1A.

FIG. 1A shows an example of a 1 kHz sinusoidal wave 110 encoded by PCM with no noise-shaping, along with clipping levels 120a and 120b. FIG. 1B shows the spectrum 130 of the signal 110 of FIG. 1A. In the audio band, the signal 110 is a single sinusoidal wave with a peak amplitude of 0.5 arbitrary units. There is no out-of-band noise present in the signal 110 and clipping the signal to +−0.5 does not affect the signal.

Figure 2A:
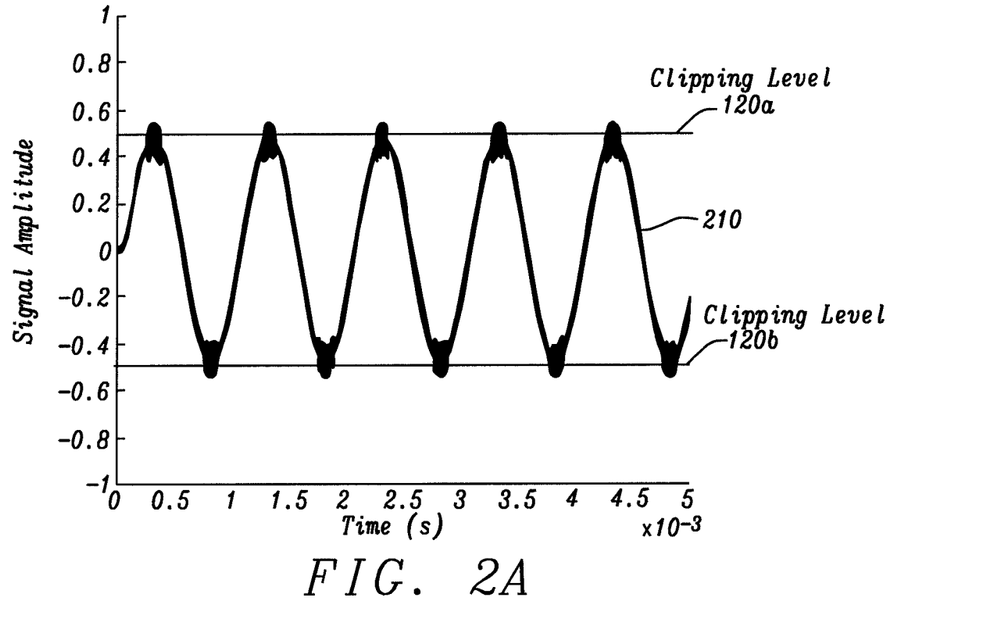
FIG. 2A is a sinusoidal signal encoded using sigma delta modulation.
Figure 2B:
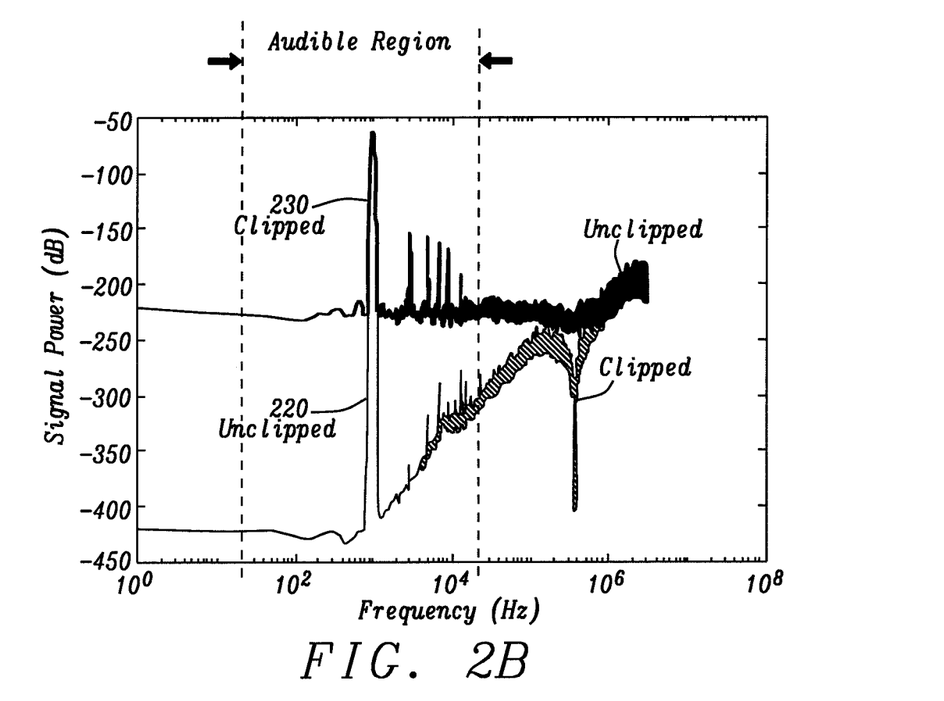
FIG. 2B is the spectrum of the signal of FIG. 2A obtained with and without clipping.

FIG. 2A shows an example of a 1 kHz sinusoidal wave 210 encoded by SDM and converted to a signal with the same number of quantization levels as a the PCM signal 110. The data or sample values locates above and below the threshold levels 120a and 120b are caused by out-of-band noise. FIG. 2B illustrates the spectrum 220 of the signal 210 obtained without clipping, and the spectrum 230 obtained by applying a hard limit to the input signal 210 and referred to as hard clipping. The spectrum 220 display significant noise above the audible region. When hard clipping is applied any sample values greater than the maximum threshold level 120a, in this example 0.5, are set to the maximum threshold level (0.5) and any sample values less than the minimum threshold level 120b, in this example −0.5 are set to the minimum threshold level (−0.5). This results in a significant increase in the noise floor of the spectrum across a wide range of frequencies, including within the audible region between about 20 Hz to about 20 kHz, as evidenced by spectrum 230.

Figure 3:
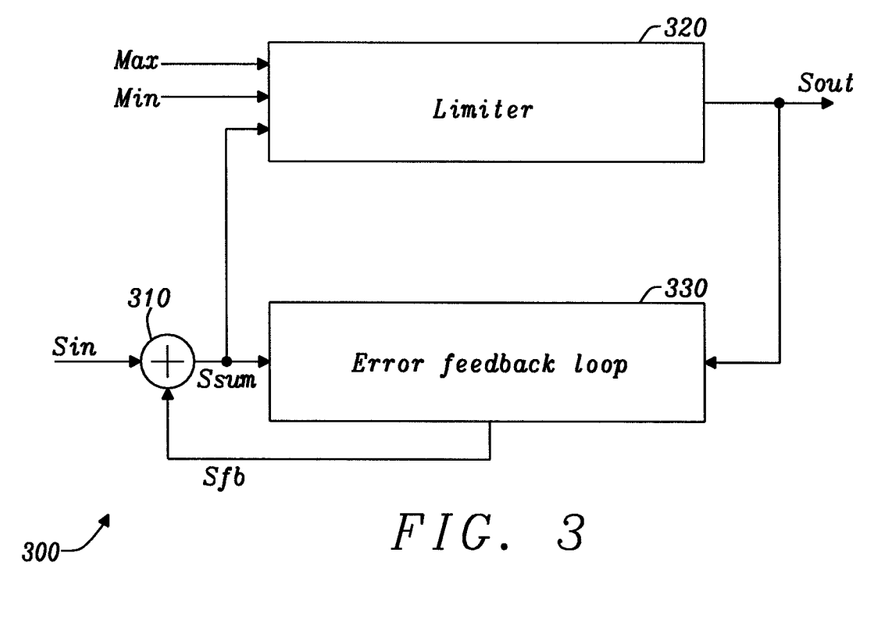
FIG. 3 is a diagram of a signal processor according to the disclosure.

FIG. 3 is a diagram of a signal processor for clipping or limiting an audio signal. The signal processor 300 includes a summer also referred to as input adder 310 coupled to a limiter 320 and to an error feedback circuit 330 also referred to as error feedback loop.

In operation the signal processor 300 limits the input signal Sin to the limit levels defined by Max_val and Min_val. The feedback loop 330 calculates the difference between the output of the limiter and the input of the limiter for every sample and feed it back into the next sample. The adder 310 receives an input signal $S_{in}$ and an error feedback signal $S_{fb}$ from the error feedback loop to produce an adjusted signal $S_{sum}=S_{in}+S_{fb}$. The limiter 320 receives the signal $S_{sum}$ and compares it with a maximum value Max_val and a minimum value Min_Val. The minimum and maximum values Max_val and Min_val may be programmable values. The limiter 320 is adapted to control the output signal value as follows. If $S_{sum}$>Max_val, the limiter 320 provides an output signal $S_{out}$=Max_val. If $S_{sum}$<Min_Val, the limiter 320 provides an output signal $S_{out}$=Min_val. If Max_val≤$S_{sum}$≤Min_val, the limiter 320 outputs an output signal $S_{out}$=$S_{sum}$. The error feedback loop 330 receives the output signal $S_{out}$ from the limiter 320 and compares $S_{out}$ with $S_{sum}$ to generate the feedback signal $S_{fb}$.

Using the signal processor 300 permits to shift the noise introduced by clipping out-of band sample values such that it appears mainly out-of-band. For instance out-of-band noise may be the noise contained in frequencies outside the audio frequency band discernible by the human ear that is between about 20 Hz to about 20 kHZ.

Figure 4:
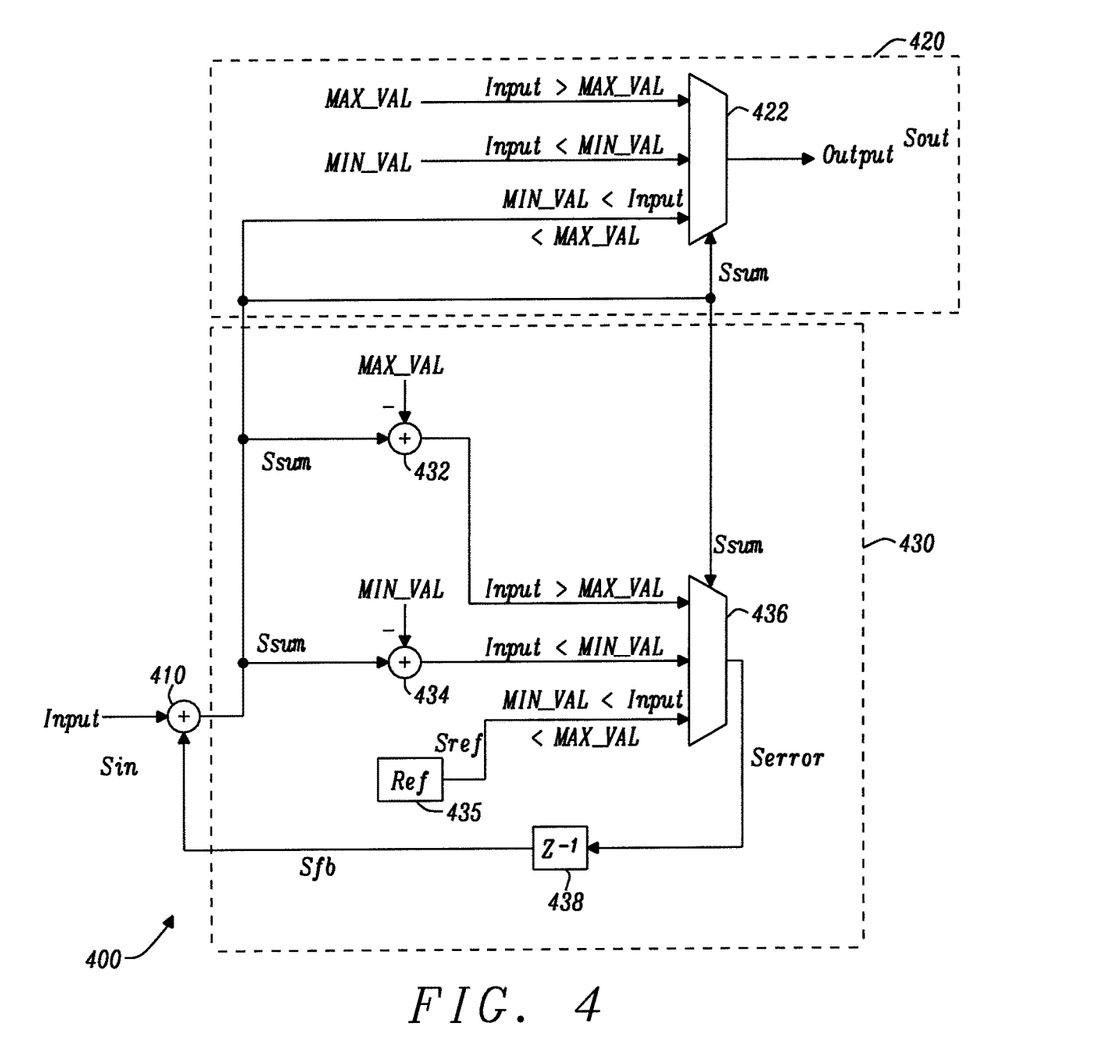
FIG. 4 is an exemplary embodiment of the signal processor according to FIG. 3 provided with a first order feedback loop.

FIG. 4 is an exemplary embodiment of the signal processor of FIG. 3. The signal processor 400 includes an input adder 410 coupled to a limiter 420 and an error feedback circuit 430. The limiter 420 includes a data selector 422 implemented as a 3 to 1 multiplexer. The multiplexer 422, also referred to as clipping multiplexer, has a first input to receive the value Max_val, a second input to receive the value Min_val, and a third input to receive the signal $S_{sum}$. The multiplexer 422 is also provided with a selection input to receive the signal $S_{sum}$.

The feedback loop circuit 430 includes two subtractors 432 and 434 and a reference source 435 coupled to the input channels of an error multiplexer 436; and a delay 438 coupled to the output of the error multiplexer. The first subtractor 432 has a first input to receive the signal $S_{sum}$ and a second input to receive the maximum threshold value Max_val. Similarly, the second subtractor 434 has a first input to receive the signal $S_{sum}$ and a second input to receive the minimum threshold value Min_val. The error multiplexer 436 has a first input to receive the output of the first subtractor 432 defined as $S_{sum}$–Max_val, a second input to receive the output of the second subtractor 434 defined as $S_{sum}$–Min_val, and a third input to receive a reference signal $S_{ref}$ from the reference source 435. For instance the reference signal may be a constant value such as a zero value or a small DC value. Alternatively the reference signal may vary over time. For instance the reference signal may include a high frequency component. The error multiplexer 436 is also provided with a selection input to receive the signal $S_{sum}$. The output of the multiplexer 436 is coupled to a delay 438. The delay 438 may be a Z-domain delay cell. The input signal $S_{in}$ may be an audio signal encoded by sigma delta modulation SDM. This may be achieved using a sigma delta DAC. The delay 438 may be designed to implement a delay at the same rate as the sigma delta DAC.

In operation the error multiplexer 436 receives the signal $S_{sum}$ at the selection input and provides an error signal $S_{error}$, also referred to as clipping error signal, by selecting one of its three channel inputs. Stated another way the signal $S_{sum}$ is used as a selection signal to connect the desired channel input of the multiplexer to its output. If $S_{sum}$>Max_val, the multiplexer 436 outputs an error signal $S_{error}$=$S_{sum}$–Max_val. If $S_{sum}$<Min_Val, the multiplexer 436 outputs an error signal $S_{error}$=$S_{sum}$–Min_val. If Min_val≤$S_{sum}$≤Max_val, the multiplexer 436 outputs an error signal $S_{error}$=$S_{ref}$, for example zero. The error signal $S_{error}$ is then delayed by the delay 438 to produce the feedback signal $S_{fb}$. The feedback signal $S_{fb}$ is then fed to the adder 410 to produce the signal $S_{sum}$=$S_{in}$+$S_{fb}$.

The clipping multiplexer 422 receives the threshold values Max_val and Min_val at its first and second input channels respectively. The signal $S_{sum}$ is received at the third channel input and the selection input. If $S_{sum}$>Max_val, the multiplexer 422 provides an output signal $S_{out}$=Max_val. If $S_{sum}$<Min_Val, the multiplexer 422 provides an output signal $S_{out}$=Min_val. If Max_val≤$S_{sum}$≤Min_val, the multiplexer 422 provides an output signal $S_{out}$=$S_{sum}$.

Figure 5A:
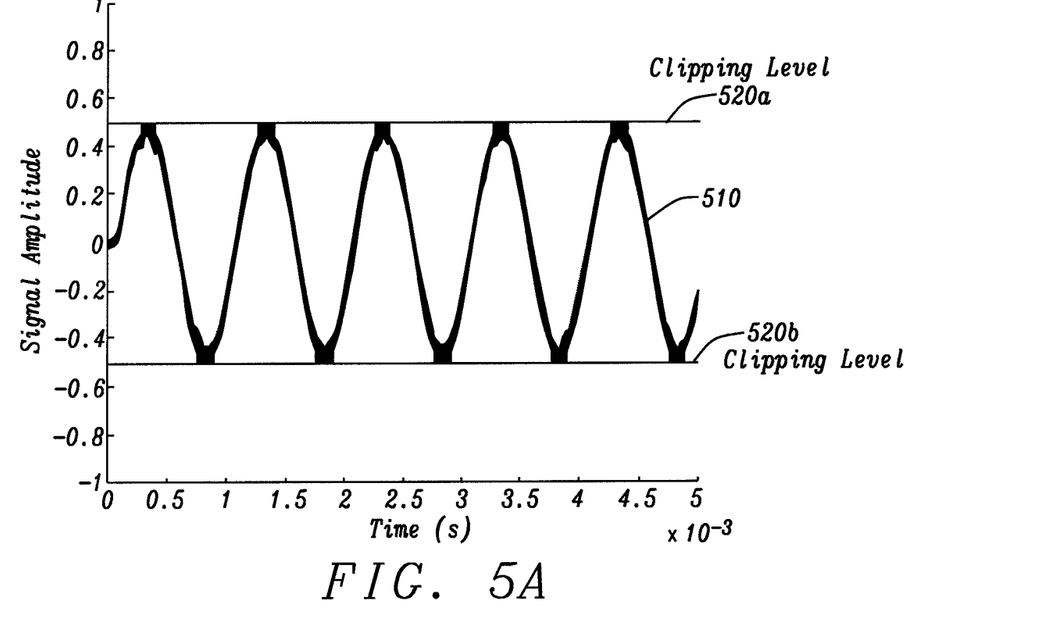
FIG. 5A is a sinusoidal input signal processed using the circuit of FIG. 4.
Figure 5B:
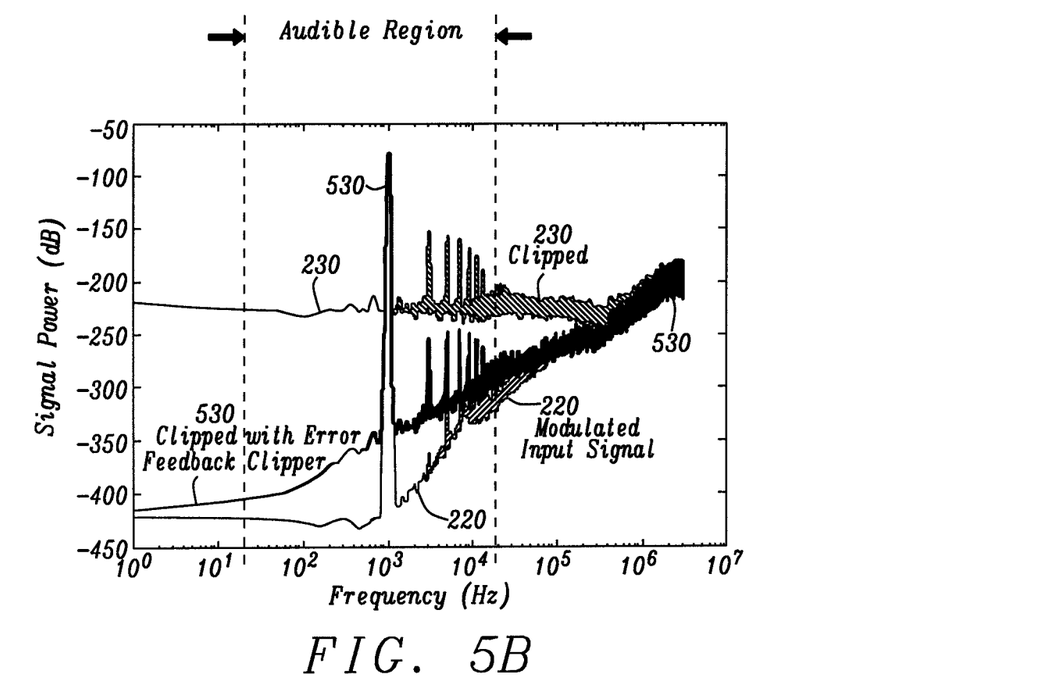
FIG. 5B is a series of three spectra: a first spectrum derived from an input signal; a second spectrum derived from the input signal processed using hard clipping and a third spectrum derived from the input signal processed using the circuit of FIG. 4.

FIG. 5A shows an example of a 1 kHz sinusoidal wave 510 encoded by SDM and processed using the circuit of FIG. 4. FIG. 5B shows the spectrum 530 of the input signal 510 processed using the circuit of FIG. 4. For comparison the spectra 220 and 230 described in FIG. 2B are also presented. Within the audible region, the noise floor of the spectrum 530 has decreased significantly compared with the noise floor of the spectrum 230. For instance at 100 Hz the noise floor of the spectrum 530 is about −390 dB compared with about −230 dB for spectrum 230. Therefore in-band noise has been reduced significantly compared with the level of noise introduced by applying a hard limit to the input signal. However the noise floor of spectrum 530 remains higher than the noise floor of spectrum 220. The proposed signal processor 400 may be considered as a circuit with a first order feedback loop. Further noise reduction can be obtained by implementing higher orders of feedback.

Figure 6:
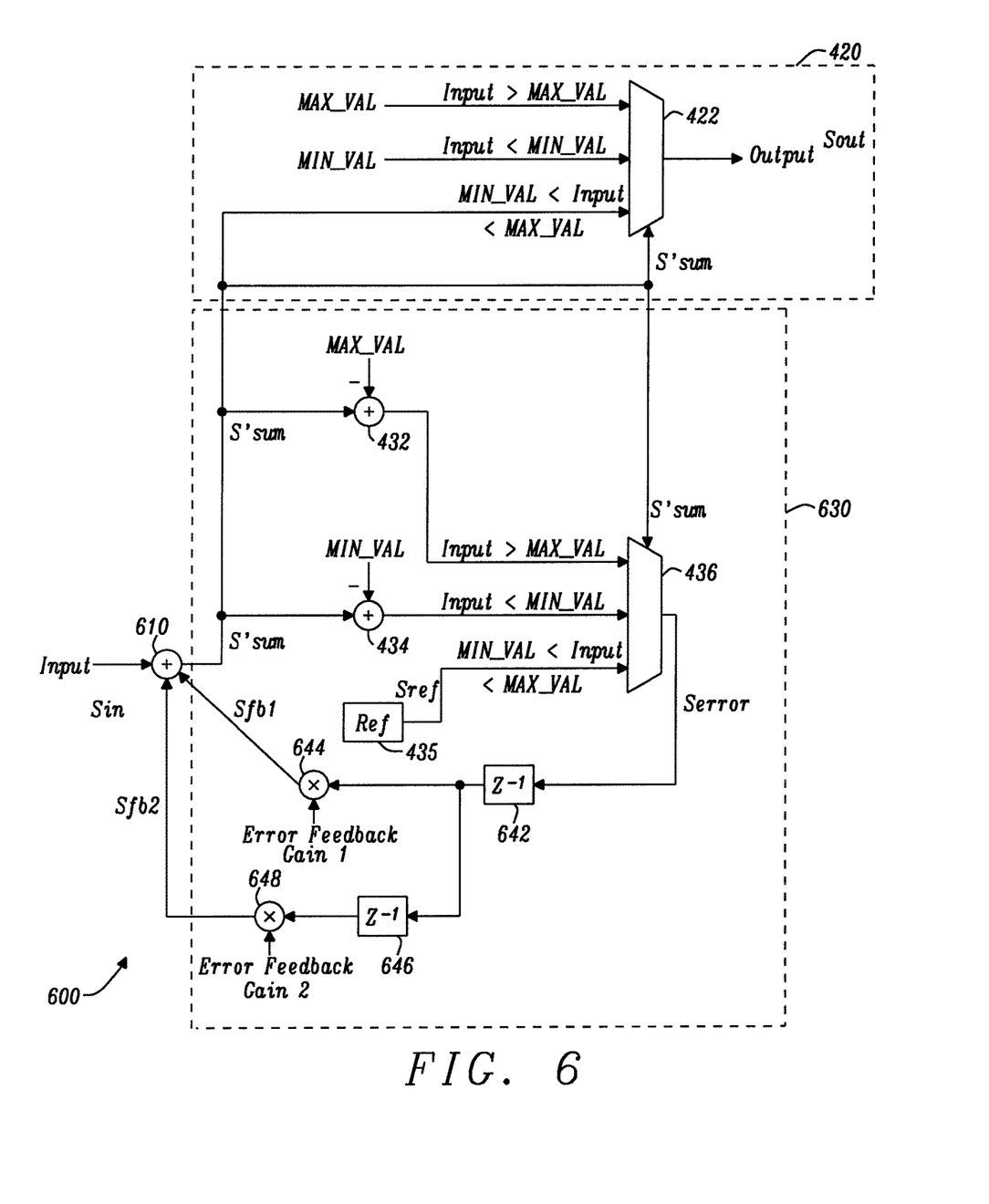
FIG. 6 is another exemplary embodiment of the signal processor according to FIG. 3 provided with a second order feedback loop.

FIG. 6 shows a signal processor provided with a second order feedback loop. The processor 600 is similar to the processor 400 described with reference to FIG. 4, in which certain parts of the circuit have been added/modified. Components which are same or similar to the processor 400 are described using the same reference numerals and their description will not be repeated for sake of brevity. The circuit 600 includes an adder 610 coupled to a limiter 420 as described with respect to FIG. 4 and a second order feedback loop 630. The second order feedback loop 630 includes the subtractors 432 and 434 coupled to the error multiplexer 436. The output of the error multiplexer 436 is coupled to the adder 610 via a firth feedback path to provide a first feedback signal $S_{fb1}$ and a second feedback path to provide a second feedback signal $S_{fb2}$. The first feedback path is formed by a first delay 642 coupled to a gain element 644. The second feedback path is formed by the first delay 642 coupled in series with a second delay 646 and a second gain element 648.

In operation, the error multiplexer 436 provides an error signal $S_{error}$ as explained above with reference to FIG. 4. The error signal $S_{error}$ is delayed by a first period by the delay 642 and its amplitude adjusted by the gain element 644 to produce the first feedback signal $S_{fb1}$. The error signal $S_{error}$ is also further delayed by an additional second period by the delay 646 and its amplitude adjusted by the gain element 648 to produce the second feedback signal $S_{fb2}$. The adder 610 then receives the feedback signals $S_{fb1}$ and $S_{fb2}$ to provide the adjusted signal $S'_{sum}$=$S_{in}$+$S_{fb1}$+$S_{fb2}$.

The first gain of the gain elements 644, referred to as Error Feedback Gain 1, and the second gain of the gain element 648, referred to as Error Feedback Gain 2 may be programmable. The first gain and the second gain may be set by considering the first and second feedback paths as a filter. For instance the publication titled "The Implementation of Recursive Digital Filters for High-Fidelity Audio" by Jon Dattorro, Journal of Audio Engineering Society, Volume 36, Number 11, November 1988 describes how noise-shaping coefficients may be chosen in a normal biquad filter. A similar approach may be applied for selecting the gains of gains elements 644 and 648. Alternatively the gains may be limited to integers, allowing for efficient hardware implementation.

Following the same principle as described above, higher orders feedback loops may be implemented. For instance a third order feedback loop may be implemented with three feedback path, each path providing its own feedback signal. This could be implemented using three delays and three gain elements to produce three feedback signals fed to the adder.

Figure 7:
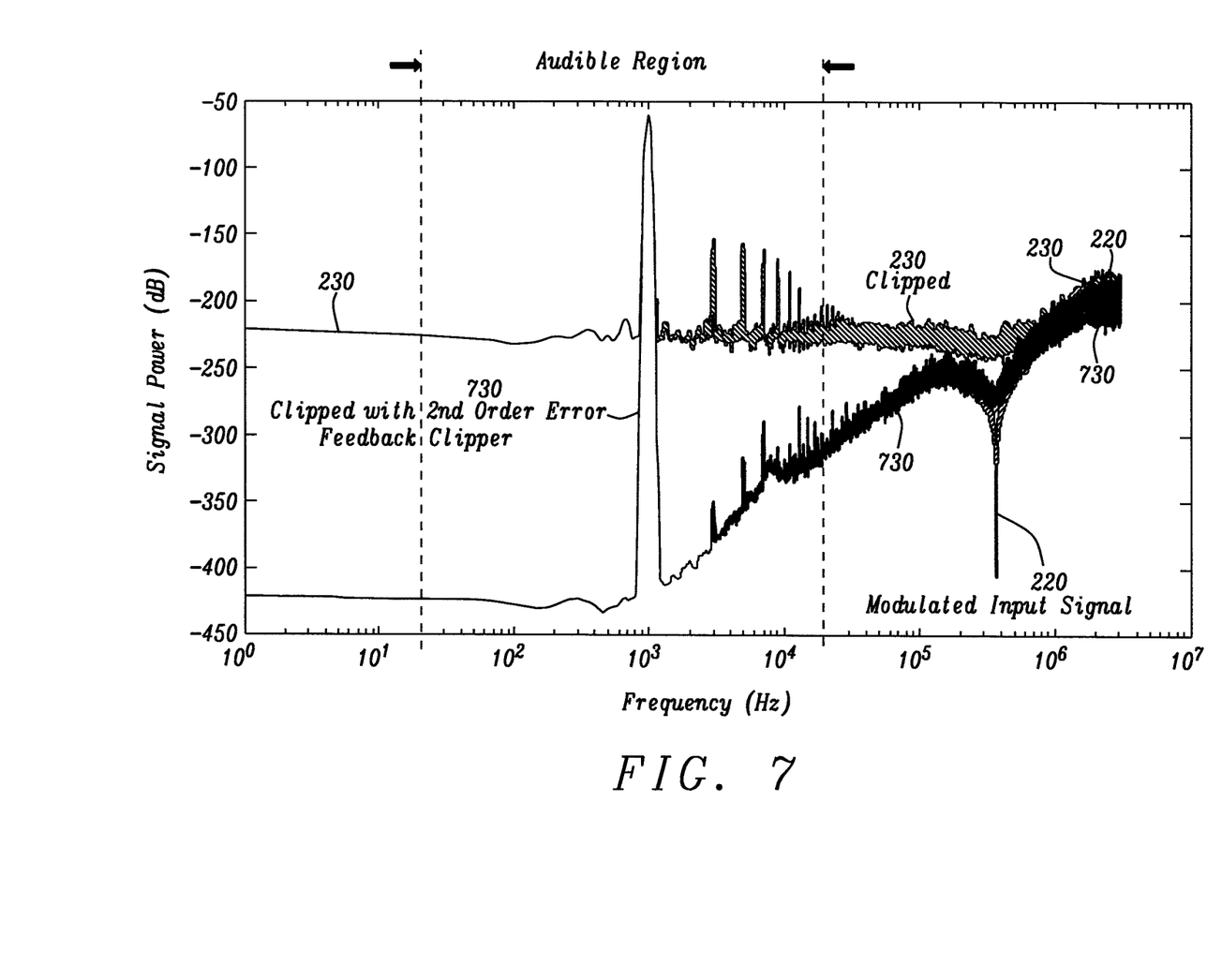
FIG. 7 is a series of three spectra: a first spectrum derived from an input signal; a second spectrum derived from the input signal processed using hard clipping and a third spectrum derived from the input signal processed using the circuit of FIG. 6.

FIG. 7 shows the spectrum 730 derived from an input signal processed using the circuit of FIG. 6. For comparison the spectra 220 (without clipping) and 230 (with hard clipping) described in FIG. 2B are also presented. By setting the gains of elements 644 and 648 as Error Feedback Gain 1=2 and Error Feedback Gain 2=−1, the spectrum 730 of the example input signal results in a noise profile very close to the modulated input 220.

The signal processors of FIGS. 3, 4 and 6 may be modified to quantise the processor output such that it uses a different number of quantization levels than the input.

Figure 8:
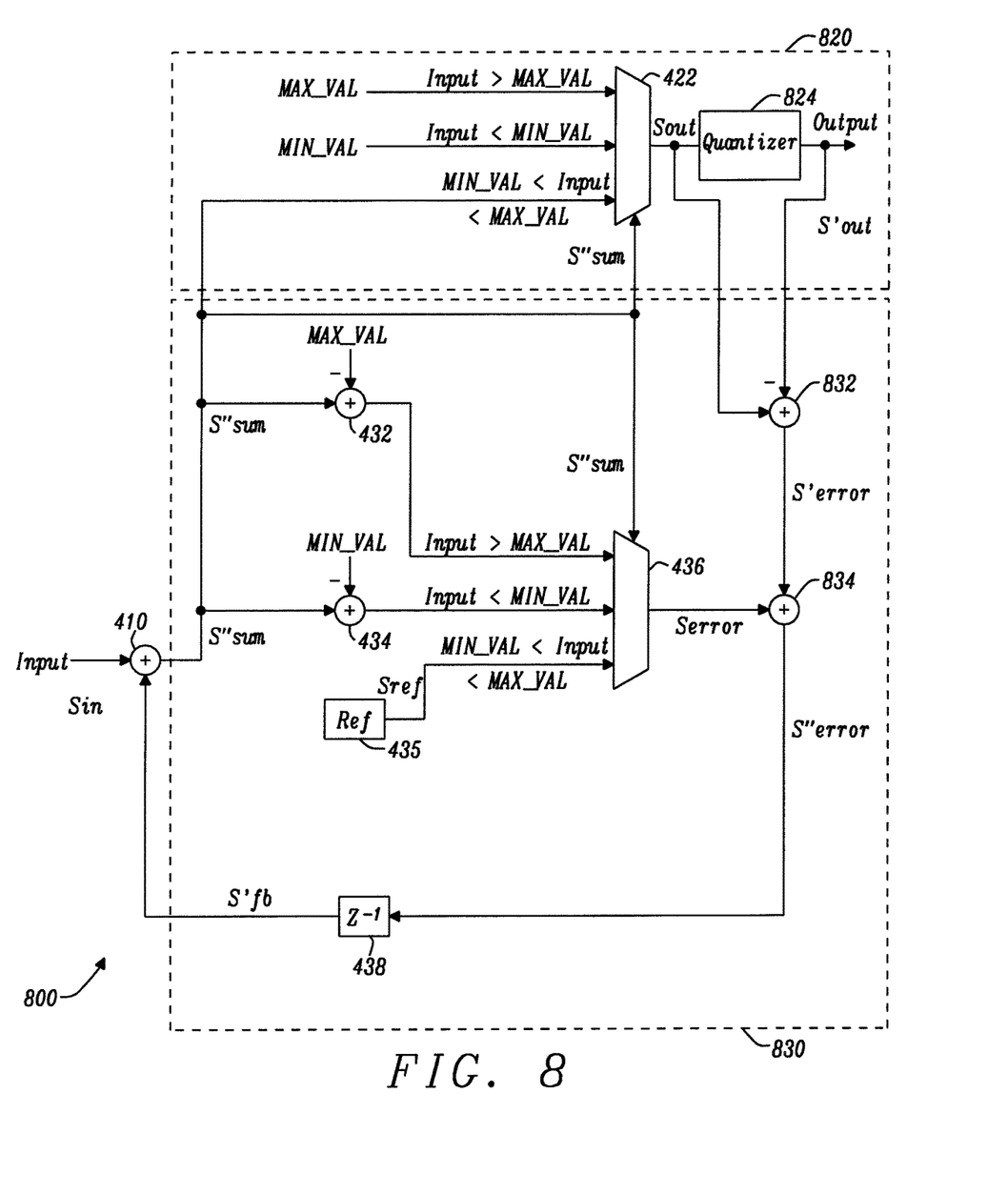
FIG. 8 is another exemplary embodiment of the signal processor according to FIG. 3 provided with a quantizer.

FIG. 8 shows a modified version of the processor of FIG. 4. Components which are same or similar to the processor 400 are described using the same reference numerals and their description will not be repeated for sake of brevity.

The circuit 800 includes an input adder 410 coupled to a limiter 820 and to a feedback circuit 830. The limiter 820 includes a clipping multiplexer 422 coupled to a quantizer 824. The feedback circuit 830 includes the error subtractors 432 and 434 coupled to the error multiplexer 436, an output subtractor 832 and an output adder 834. The output subtractor 832 is coupled to the output of the clipping multiplexer 422 and to the output of the quantizer 824. The output adder 834 is coupled to the output of the output subtractor 832 and to the output of the error multiplexer 436. The output adder 834 is coupled to the delay 438 to produce the feedback signal $S'_{fb}$.

In operation the output signal $S_{out}$ provided by the clipping multiplexer 422 is received by the quantizer 824 to provide a quantized output signal $S'_{out}$. The output subtractor 832 receives the signals $S_{out}$ and $S'_{out}$ to generate the quantization error signal $S'_{error}=S_{out}-S'_{out}$ indicative of quantization noise between the quantized signal and the original signal. The output adder 834 receives the clipping error signal $S_{error}$ from the error multiplexer 436 and the quantization error signal $S'_{error}$ from adder 832 and provides a total error signal $S''_{error}=S_{error}+S'_{error}$. The total error signal $S''_{error}$ is then delayed by delay 438 to generate the feedback signal $S'_{fb}$. Using this approach the quantization error is included into the error feedback path.

Figure 9:
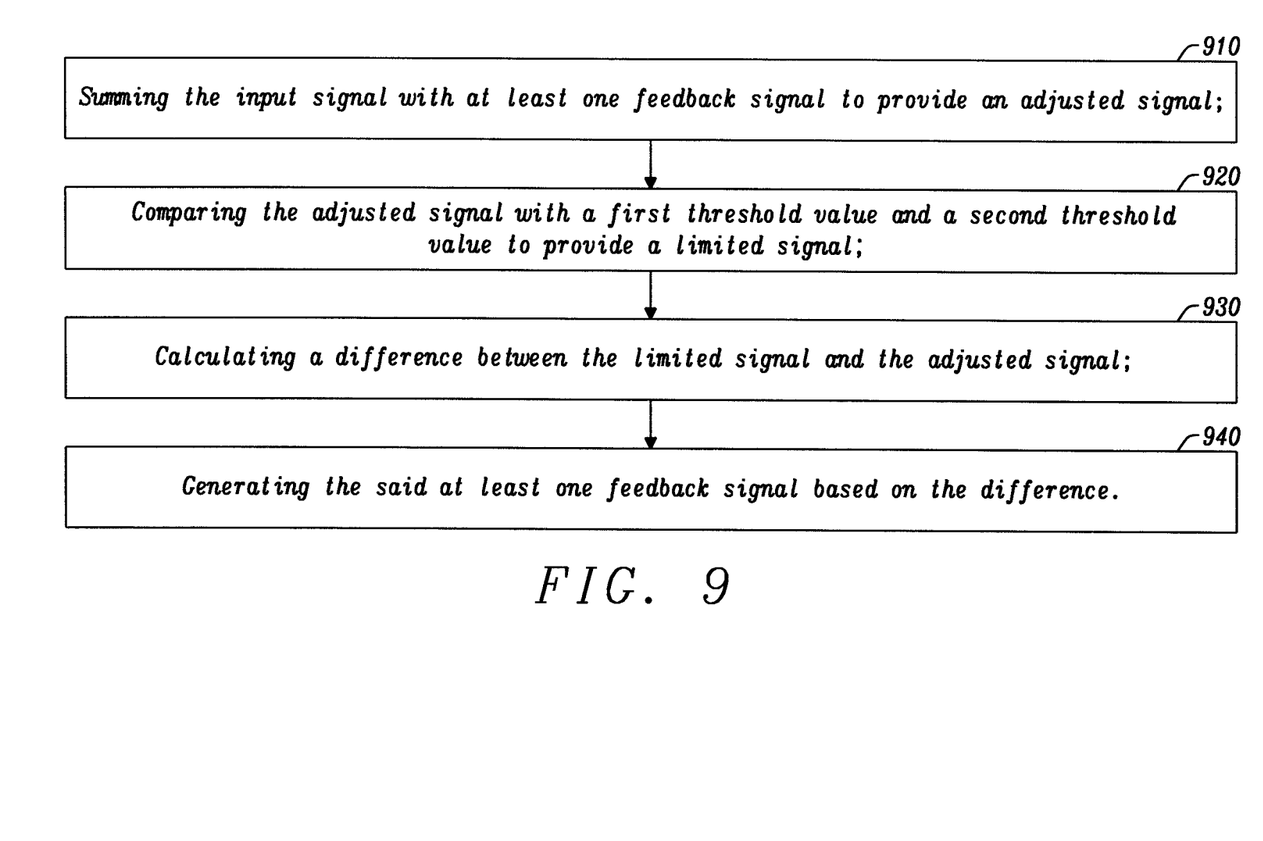
FIG. 9 is a flow chart of a method for processing a signal.

FIG. 9 is a flow chart of a method for processing a signal such an audio signal. At step 910 the input is summed with one or more feedback signals to provide an adjusted signal. The input signal may be an oversampled signal such as an SDM modulated signal. At step 920 the adjusted signal is compared with a first threshold value and a second threshold value to provide a limited signal. At step 930 a difference is calculated between the limited signal and the adjusted signal. At step 940 one or more feedback signals are generated based on the calculated difference.

To provide the one or more feedback signals an error signal may be generated as follows. The adjusted signal has an amplitude that varies with time. When the adjusted signal has an amplitude greater than the first threshold value, the error signal is equal to the adjusted signal minus the first threshold value. When the adjusted signal has an amplitude less than the second threshold value, the error signal is equal to the adjusted signal minus the second threshold value; and when the adjusted signal has an amplitude between the first threshold value and the second threshold value, the error signal is equal to a reference signal. For instance the reference signal may be a pre-set constant value, for example a zero value. Alternatively the reference signal may vary over time. For instance, the reference signal may have a high frequency component. Using this approach, an oversampled input signal can be clipped while limiting the introduction of noise in the frequency band of interest.

A skilled person will appreciate that variations of the disclosed arrangements are possible without departing from the disclosure. Accordingly, the above description of the specific embodiment is made by way of example only and not for the purposes of limitation. It will be clear to the skilled person that minor modifications may be made without significant changes to the operation described.

What is claimed is:

1. A signal processor for processing an input signal, the signal processor comprising
   a summer adapted to sum the input signal with at least one feedback signal to provide an adjusted signal;
   a limiter adapted to compare the adjusted signal with a first threshold value and a second threshold value to provide a limited signal;
   a feedback circuit adapted to calculate a difference between the limited signal and the adjusted signal, and to generate the said at least one feedback signal based on the difference.

2. The signal processor as claimed in claim 1, wherein the feedback circuit is adapted to provide an error signal such that
   when the adjusted signal is greater than the first threshold value, the error signal is equal to the adjusted signal minus the first threshold value;
   when the adjusted signal is less than the second threshold value, the error signal is equal to the adjusted signal minus the second threshold value; and
   when the adjusted signal is between the first threshold value and the second threshold value, the error signal is equal to a reference signal.

3. The signal processor as claimed in claim 2, wherein the feedback circuit is adapted to delay the error signal to generate the said at least one feedback signal.

4. The signal processor as claimed in claim 1, wherein
   when the adjusted signal is greater than the first threshold value, the limited signal is equal to the first threshold value;
   when the adjusted signal is less than the second threshold value, the limited signal is equal to the second threshold value; and
   when the adjusted signal is between the first threshold value and the second threshold value, the limited signal is equal to the adjusted signal.

5. The signal processor as claimed in claim 1, wherein the feedback circuit comprises a first subtractor adapted to subtract the first threshold value from the adjusted signal to provide a first error value and a second subtractor adapted to subtract the second threshold value from the adjusted signal to provide a second error value.

6. The signal processor as claimed in claim 5, wherein the feedback circuit comprises a multiplexer having a first input coupled to the first subtractor, a second input coupled to the second subtractor and a third input coupled to a reference source; the multiplexer being coupled to the summer via a first path comprising a first delay.

7. The signal processor as claimed in claim 6, wherein the said at least one feedback signal comprises a first feedback signal and a second feedback signal;
- the multiplexer being coupled to the summer via the first path and a second path;
- wherein the first path comprises a first gain element coupled to the first delay to generate the first feedback signal; and
- wherein the second path comprises the first delay, a second delay and a second gain element to generate the second feedback signal.

8. The signal processor as claimed in claim 1, comprising a quantizer to quantize the limited signal.

9. The signal processor as claimed in claim 8, wherein the feedback circuit is adapted to calculate a quantization error, wherein the said at least one feedback signal comprises the quantization error.

10. The signal processor as claimed in claim 9, wherein the feedback circuit comprises
- an output subtractor adapted to subtract an output of the quantizer from the limited signal to provide the quantization error, and
- an output summer adapted to sum the error signal with the quantization error to provide an adjusted error signal.

11. The signal processor as claimed in claim 1, wherein the input signal comprises a delta-sigma modulated signal.

12. The signal processor as claimed in claim 11, wherein the input signal comprises a pulse-code modulated signal.

13. A method of processing an input signal, the method comprising
- summing the input signal with at least one feedback signal to provide an adjusted signal;
- comparing the adjusted signal with a first threshold value and a second threshold value to provide a limited signal;
- calculating a difference between the limited signal and the adjusted signal; and
- generating the said at least one feedback signal based on the difference.

14. The method as claimed in claim 13, comprising generating an error signal, wherein
- when the adjusted signal is greater than the first threshold value, the error signal is equal to the adjusted signal minus the first threshold value;
- when the adjusted signal is less than the second threshold value, the error signal is equal to the adjusted signal minus the second threshold value; and
- when the adjusted signal is between the first threshold value and the second threshold value, the error signal is equal to a reference signal.

15. The method as claimed in claim 14, comprising delaying the error signal to generate the said at least one feedback signal.

16. The method as claimed in claim 14, wherein the said at least one feedback signal comprises a first feedback signal and a second feedback signal; the method comprising delaying the error signal to obtain a first delayed error signal and delaying the first delayed error signal to obtain a second delayed error signal, generating the first feedback signal based on the first delayed error signal and generating the second feedback signal based on the second delayed error signal.

17. The method as claimed in claim 14, comprising quantizing the limited signal.

18. The method as claimed in claim 17, comprising calculating a quantization error, wherein the said at least one feedback signal comprises the quantization error.

* * * * *

UNITED STATES PATENT AND TRADEMARK OFFICE
CERTIFICATE OF CORRECTION

| | |
|---|---|
| PATENT NO. | : 10,784,890 B1 |
| APPLICATION NO. | : 16/407227 |
| DATED | : September 22, 2020 |
| INVENTOR(S) | : Ashley Hughes and Wessel Harm Lubberhuizen |

It is certified that error appears in the above-identified patent and that said Letters Patent is hereby corrected as shown below:

In the Specification

In Column 1, Line 6, delete Ser. No. "16/407,427" and replace with -- 16/407,247 --.

Signed and Sealed this
Seventeenth Day of January, 2023

Katherine Kelly Vidal
*Director of the United States Patent and Trademark Office*